United States Patent [19]

Keller et al.

[11] 4,339,768

[45] Jul. 13, 1982

[54] TRANSISTORS AND MANUFACTURE THEREOF

[75] Inventors: Joseph R. Keller, Harrisburg; Billy E. Olsson, New Cumberland, both of Pa.

[73] Assignee: AMP Incorporated, Harrisburg, Pa.

[21] Appl. No.: 113,159

[22] Filed: Jan. 18, 1980

[51] Int. Cl.³ .................... H01L 23/28; H01L 23/48; H01L 23/02
[52] U.S. Cl. .................................... 357/72; 357/70; 357/81
[58] Field of Search ............................ 357/70, 72, 81

[56] References Cited

U.S. PATENT DOCUMENTS

| | | | |
|---|---|---|---|
| 3,532,944 | 10/1970 | Lendorf et al. | 357/81 |
| 3,574,815 | 4/1971 | Segerson | 357/70 |
| 3,606,673 | 9/1971 | Overman | 357/70 |
| 3,706,915 | 12/1972 | Lootens | 357/81 |
| 4,124,864 | 11/1978 | Greenberg | 357/70 |
| 4,125,740 | 11/1978 | Paletto | 357/70 |
| 4,142,288 | 3/1979 | Flammer et al. | 357/70 |
| 4,158,745 | 6/1979 | Keller | 357/70 |

FOREIGN PATENT DOCUMENTS

| | | | |
|---|---|---|---|
| 264443 | 8/1963 | Australia | 357/81 |
| 2818080 | 11/1978 | Fed. Rep. of Germany | 357/70 |

*Primary Examiner*—Andrew J. James
*Attorney, Agent, or Firm*—Frederick W. Raring

[57] ABSTRACT

An improved transistor, an improved lead frame for use in transistor manufacture, and manufacturing methods for transistors are disclosed. The improved transistor lead frame has a premolded housing thereon which covers a substantial portion of the chip-mounting surface of the transistor heat sink. A chip-receiving cavity is provided in the molded housing which extends to the chip-receiving surface and conforms to the shape of the chip. Solder-receiving bays or bins extend laterally from the cavity to receive excess solder during bonding of the chip to the lead frame. The premolded housing surrounds the chip after it is bonded to the lead frame and when the conductors from the transistor leads to the chip are bonded in place, the housing protects these leads during subsequent handling. The hollow interior of the housing is filled with a silicone gel which encapsulates the conductors in the housing and a harder insulating material, such as epoxy, is applied over the gel.

7 Claims, 9 Drawing Figures

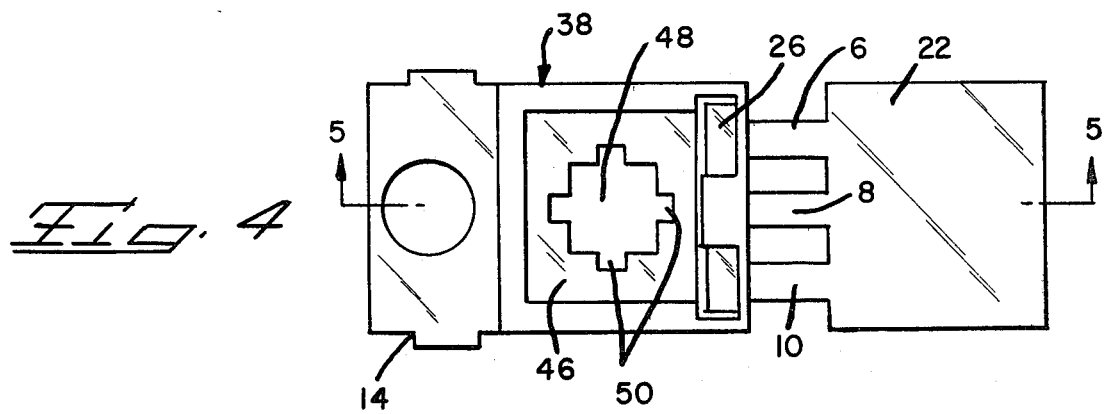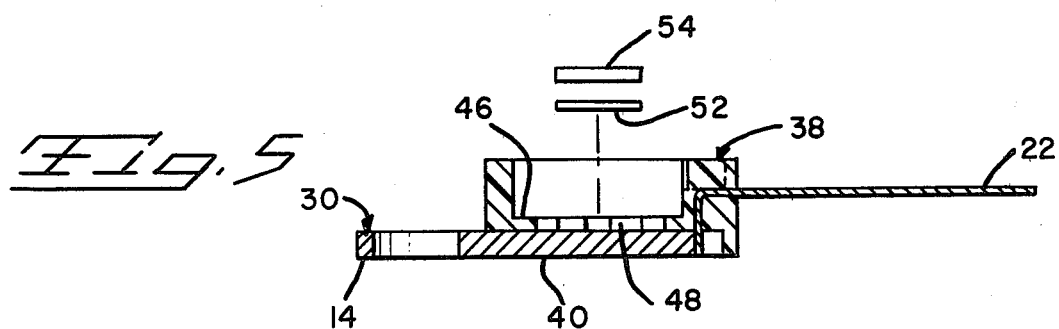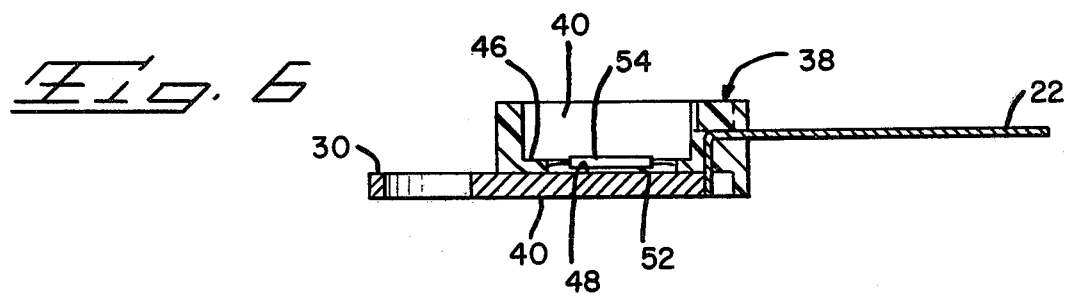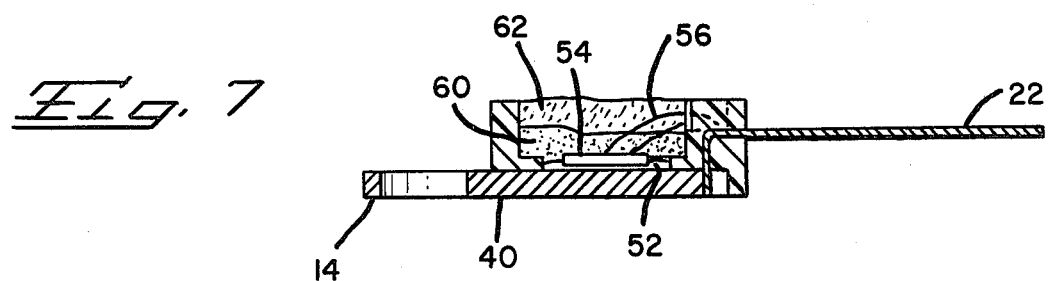

TRANSISTORS AND MANUFACTURE THEREOF

FIELD OF THE INVENTION

This invention relates to improved transistors, improved lead frames for transistors, and transistor manufacturing methods.

BACKGROUND OF THE INVENTION

A widely used type of transistor comprises a body of insulating material which serves as a housing or container for the IC chip which has three leads extending from one of its laterally facing sidewalls. One of these leads has a heat sink on its end which is contained in the insulating housing and the IC chip is bonded to one surface of this heat sink. Conductors, such as fine wires, are bonded to the emitter and base terminal areas of the IC chip and extend to, and are bonded to, the ends of the remaining leads which are also contained in the insulating housing.

The most widely used method of manufacturing transistors of the type described above is to first provide a lead frame of stamped metal having the three leads extending from a carrier member with the heat sink integral with one of the leads. The IC chip is soldered to the heat sink by providing solder between the collector side of the chip and the surface of the heat sink and passing the lead frame through a furnace to melt the solder and bring about the bonding of the chip to the heat sink. Thereafter, the emitter and base areas of the chip are electrically connected to the ends of the remaining terminals or leads, for example, by fine wire bonding, and the heat sink and the end portions of the leads are then encapsulated by molding suitable plastic insulating material onto the lead frame. The carrier strip can then be removed from the ends of the leads which now project from the molded body of plastic.

The manufacture of transistors by the methods described above, or by methods similar to those described above, entails several critical operations which must be carefully controlled. For example, the amount of solder used to bond the IC chip to the surface of the heat sink should be fully adequate to cover the entire lower surface, the collector side, of the IC chip in order to secure a firm bond and to ensure good thermal conductance of heat from the chip. If the amount of solder is inadequate to completely cover the underside of the chip, an inferior bond will result and air pockets between the chip and the heat sink will remain, which will seriously interfere with the transfer of heat to the heat sink. If, on the other hand, an excessive amount of solder is applied, the solder may flow up to the base area of the chip, on the upper side thereof, and thereby short circuit the chip, rendering the finished transistor totally useless. The chip should be precisely placed at a predetermined location on the surface of the heat sink in order to permit the use of automatic bonding equipment in the manufacturing process and slight misalignment or misplacement of the chip can result in bonds being made to the wrong areas of the chip. The molding process in which plastic is molded onto the ends of the leads and the heat sink is extremely critical in that the delicate conductors extending from the chip to the leads can be disturbed during this process and the bonds of these conductors can be broken. It is thus necessary to control all of these operations in order to achieve a good yield from the manufacturing process.

The present invention is directed to the achievement of a lead frame and a manufacturing process which permits improved control of the maufacturing steps and results in the achievement of reductions in the times required and some of the steps and to improved yields in the process.

In accordance with the principles of the invention, premolded housing is provided on the lead frame which encapsulates the inner end portions of the leads and a substantial portion of the heat sink. This housing has a chip-receiving cavity extending therein to the surface of the heat sink, the shape of this cavity conforming precisely to the shape of the chip so that placement of the chip in the cavity locates the chip precisely on the heat sink for a subsequent bonding operation and for the operation of connecting the leads to the chip by fine wires or other means. Solder-receiving binds or bays extend outwardly from the chip-receiving cavity to receive any excess solder above the required for the bonding operation thereby avoiding the possibility of solder flowing to the upper surface of the chip. The chip bonding operation is carried out by means of an induction heating apparatus which produces heat at the chip heat sink interface in a controlled manner, such that the molded housing is not not damaged during the bonding step.

Finally, after the chip has been bonded to the heat sink and the leads connected to the chip by fine wires, the chip and the leads can be encapsulated by pouring an insulating material, which will harden or set, into a well in the premolded housing in which the chip is located. Drawings:

FIG. 1 is a perspective view of a transistor in accordance with the invention.

FIG. 2 is a fragmentary perspective view of a portion of a strip of lead frames prior to molding of the premolded housing thereon.

FIG. 3 is a fragmentary view of a lead frame having the premolded portion of the housing thereon.

FIG. 4 is a top plan view of the lead frame of FIG. 3.

FIG. 5 if a sectional view taken along the lines 5—5 of FIG. 4 and showing a solder blank and an IC chip exploded from the lead frame.

FIG. 6 is a view similar to FIG. 5 showing the chip positioned on, and bonded to, the heat sink of the lead frame.

FIG. 7 is a cross-sectional view taken along the lines 7—7 of FIG. 1.

FIG. 8 is a diagrammatic view of an induction heating apparatus used for bonding the IC chip to the heat sink.

FIG. 9 is an enlarged view illustrating the bonding of the IC chip to the heat sink and showing details of the bonding apparatus.

DESCRIPTION OF THE DRAWINGS

A transistor 2, in accordance with the invention, FIG. 1, comprises a generally rectangular body 4 of molded insulating material having first, second, and third leads 6, 8, and 10, extending from one side surface 12 thereof and having an extension 14 of a heat sink extending from the opposite side surface 16. A well, as described below, extends inwardly from the upper surface 20 of the insulating body 4 and this well is filled with encapsulating material 18 which is added to the well after the IC chip has been bonded to a portion of the heat sink, which is embedded in the body 4 of insulating material. The structural details of the transistor 2 and particularly the manner in which the IC chip is supported in the insulating body is best understood from a description, as presented below, of the manufacturing process for producing the transistor.

Figure 1:
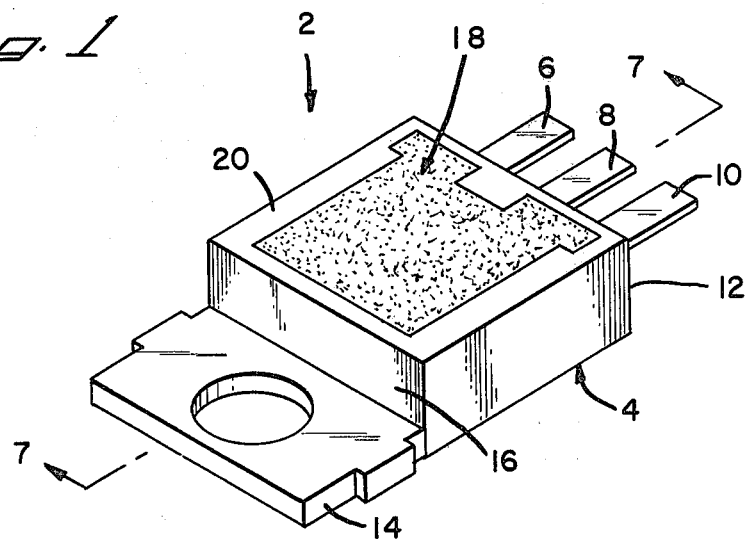
Figure 2:
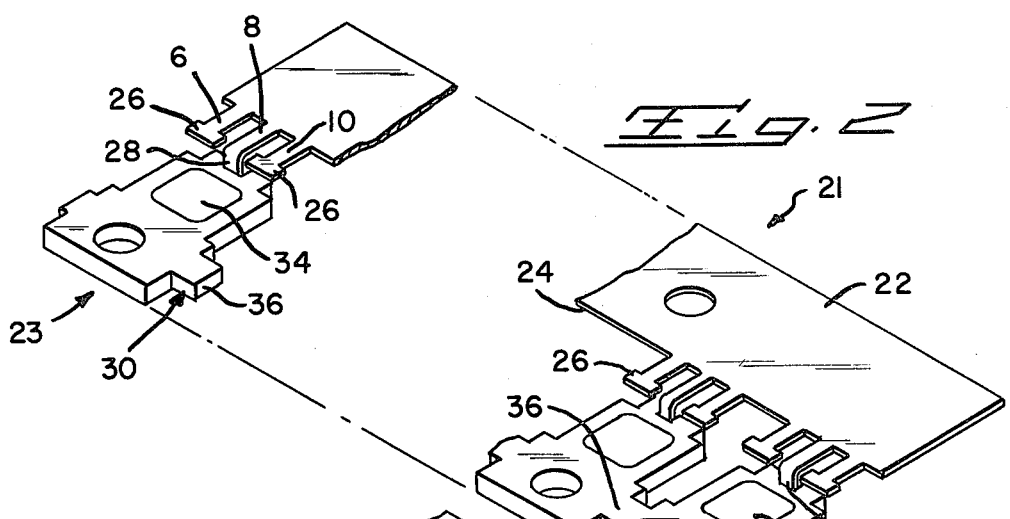
Figure 3:
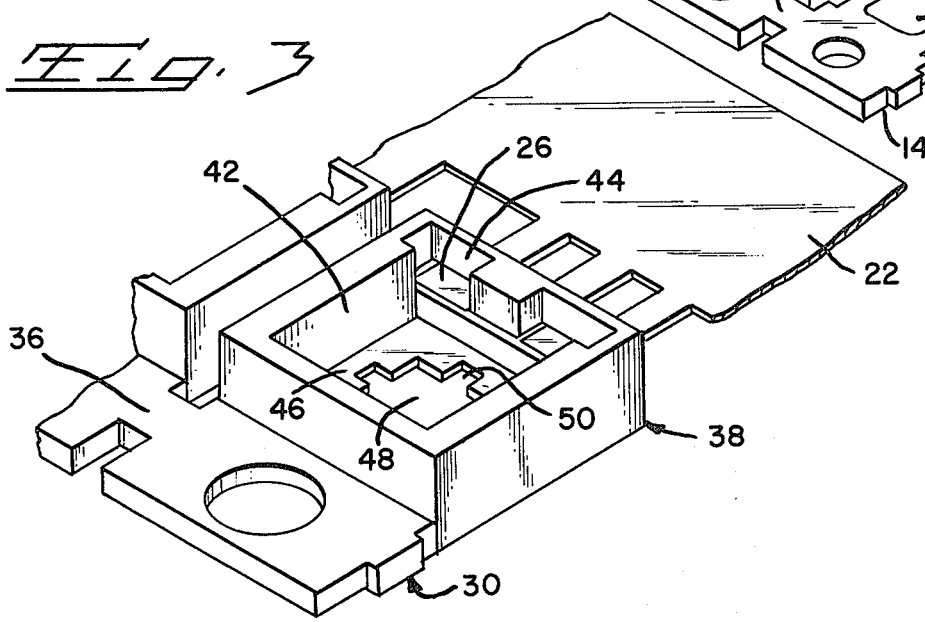

Transistors in accordance with the invention are produced by molding a housing portion 38, FIG. 3, onto each lead frame 23 of a strip 21 of lead frames, as shown in FIG. 2. This strip comprises a carrier strip 22 from one edge 24 of which the three leads 6, 8, and 10 extend. The first and third leads 6, 10 extend cantilever fashion from the edge 24 and have contact surfaces 26 on their ends which may be enlarged as shown. The second lead 8 is bent downwardly at its end 28 and the heat sink 30 is integral with this downwardly bent portion and disposed in a plane which is parallel to, but below, the plane of the carrier strip 22. It will be seen that the thickness of the heat sink portion 30 is substantially greater than the thickness of the carrier strip 22 and of the leads and, for this reason, lead frame strip 21 of this type is usually produced in discrete flat lengths rather than as a continuous strip. The heat sink 30 comprises, in addition to the outer end portion 14, a chip-mounting portion 32 which has a base or bottom surface 40 and an upwardly facing chip-mounting surface 34. Adjacent lead frames are connected to each other by connecting sections 36 which extend between adjacent heat sinks to provide stability and rigidity to the strip. It should be mentioned that it is common practice to manufacture the strip 21 by stamping two strips, one of thin metal and comprising the carrier strip 22 and the leads 6, 8, 10, and the other a thick strip of heat sink members. The two strips are joined to each other by mechanically connecting the leads 8 to the heat sinks 30.

The premolded housings 38 are molded onto the individual lead frames in a coventional injection molding process and may be of suitable relatively firm thermoplastic, such as a properly filled nylon composition. These premolded housings are generally rectangular on all surfaces thereof and a well 42 extends inwardly from the upper surface towards the chip-supporting surface 34. This well has pockets or recesses 44 on the internal sidewall thereof which is adjacent to the edge 24 of the carrier strip and the contact surfaces 26 of the first and third leads 6, 10 are exposed at the inner ends of these pockets to permit attachment of conductors thereto at a later stage in the manufacturing operation.

The well extends to a location adjacent to the surface 34 and has a floor or inner end 46 which is above the surface 34 so that a substantial portion of this surface is covered with molding material. The underside 40 of the heat sink is exposed, as shown in FIG. 5, to facilitate transfer of heat when the device is put to use. A chip-receiving cavity 48 is provided in the surface 46 and extends to the chip-receiving surface 34 of the heat sink, the sidewalls of the cavity 48 conforming to the edges of the chip 54 so that placement of the chip in the cavity locates it precisely on the heat sink and with reference to the contact surfaces 26 of the leads 6, 10. Solder-receiving bins or bays 50 extend laterally from each of the sidewalls of the cavity 48 to receive excess solder beyond that required for the bonding operation when the chip is bonded to the heat sink as described below.

The bonding operation is carried out by providing a flat blank 52 of solder cut to fit within the cavity 48, the thickness of this solder blank being such that it is capable of bonding the chip 54 to the heat sink with very little excess. This solder blank 52 is placed in the cavity 48, the chip 54 is placed on top of the blank, and heat is then supplied to the solder, by an induction heating apparatus as described below, in an amount sufficient to melt the solder. The surface 34 at the inner end of the cavity should, of course, be covered with a small amount of flux to ensure good bonding practice. During the heating operation, a light downward force is applied to the upper surface of the chip 54 to press it against the surface 34 and to cause the slight excess of solder, which is not required for the bonding operation, to flow into the solder-receiving bins 50.

After the soldering operation has been completed, the emitter and base areas of the upper surface of the chip 54 are connected to the contact portions 26 of the leads 6, 10 by conductors 56, as shown in FIG. 7. These conductors may comprise fine wires which are bonded to the chip and to the contact surfaces by wire bonding machines, or they may comprise stamped conductors of the type commonly used for transistors which require relatively high current. In either event, the precise location of the chip 54 in the chip-receiving cavity 48 facilitates this bonding operation.

After completion of the bonding step, the entire well 42 may be filled with a material such as epoxy to encapsulate the chip and the conductors 56 and seal them against the atmosphere. Alternatively, a silicone gel or similar material which does not fully harden, can be poured into the well to a level such that the chip and the conductors 56 are completely covered and a different material, such as an epoxy, can be applied over the surface of the gel, as shown at 62. The provision of the gel 60 has the advantage of permitting the leads to conform or comply with changes in the shape or dimensions of the housing, which might result from temperature changes.

Figure 8:
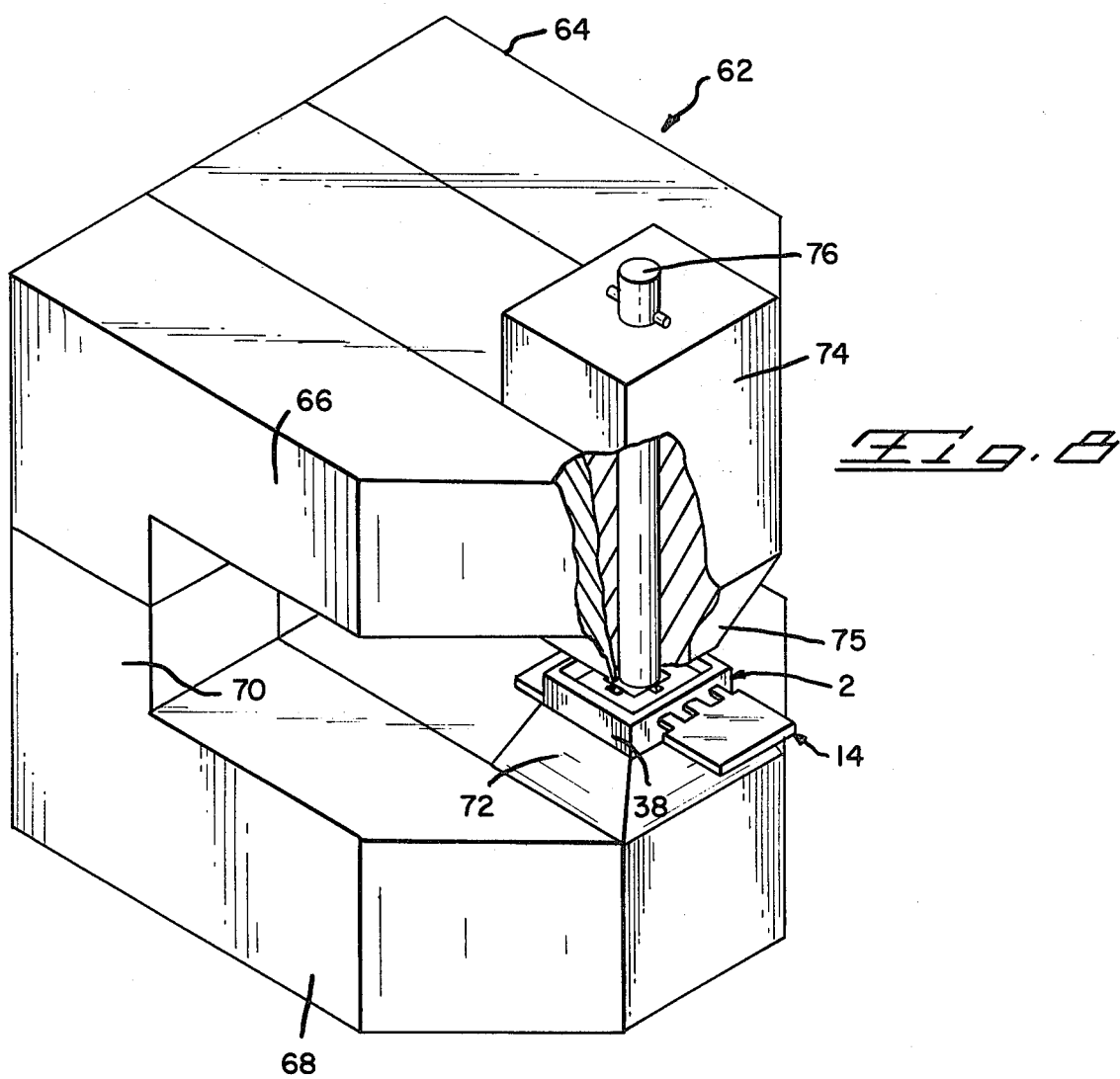
Figure 9:
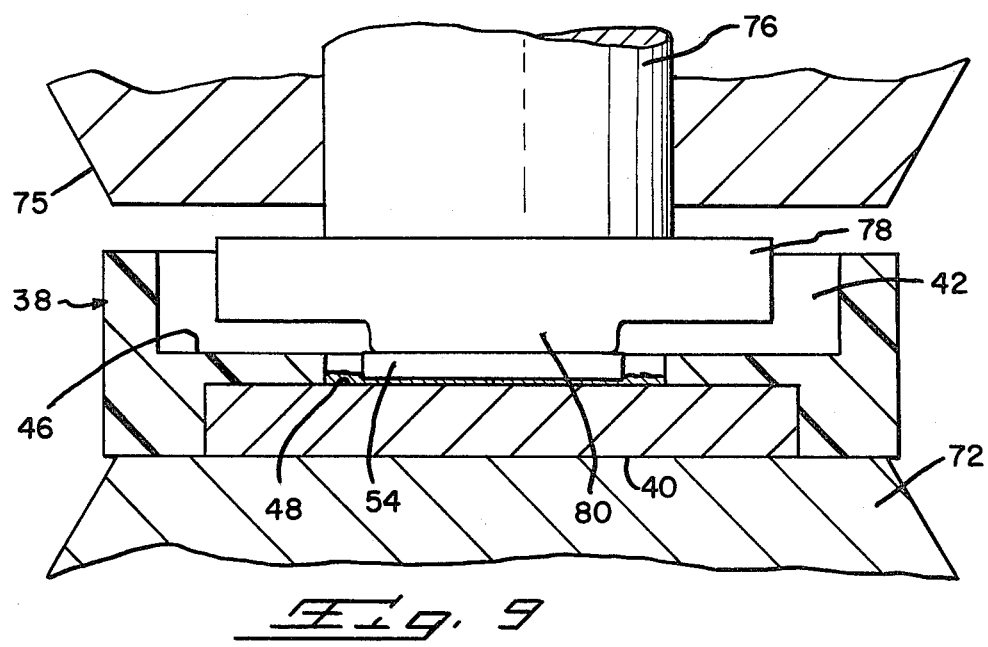

FIG. 8 shows diagrammatically an induction heating apparatus 62 of the type more fully described in Application Ser. No. 104,254 filed Dec. 17, 1979, which is hereby incorporated, by reference, in its entirety. This type of heating apparatus comprises a C-shaped ferrite core 64 having upper and lower arms 66, 68, and a vertically extending neck section around which an exciting coil (not shown) is wound. A truncated workpiece supported projection 72 is provided on the outer end of arm 68 and a slideable ram 74 which has a convergently tapered lower end 75, is provided in the upper arm 66. A hold-down and force-supplying rod 76 of insulating material is slideably mounted in the ram, to apply a force to the chip during soldering. To solder the chip to the heat sink, the lead frame is positioned on the surface of the work support 72. An insulating film may be placed between the lower surface 40 of the heat sink and the surface of the support to separate these two members and to prevent conduction of heat from the heat sink. A clamping member of insulating material 78, which may be integral with rod 76, FIG. 9, is positioned on the surface 46 of the lead frame and a projecting portion 80 of this clamping member 78 extends into the chip-receiving cavity and bears against the upper surface of the chip. It will thus be apparent that a normal force is applied to the chip, the magnitude of which is determined by the weight of the rod 76. While the chip is thus clamped under a relatively light clamping pressure, the exciting coil is energized with a high frequency alternating current thereby to induce magnetic flux in the core 64. The flux lines are concentrated between tapered work support 72 and the lower end of the ram 74 so that the flux lines pass centrally through the chip and through the central portion of the heat sink on which the chip is supported. This magnetic flux induces a current in the solder blank which in turn causes melting of the solder and flow of excess solder out from under the chip. The amount of solder which remains under the chip will be determined by the magnitude of the force applied to the chip and the excess solder will flow into the solder-receiving bins 50. During soldering, these bins will also permit the escape of gases evolved by the action of the flux so that no entrapped gases will remain in the vicinity of the IC chip.

Upon raising the rod 76 and/or the ram 74, and de-energizing the coil, the solder will solidify almost immediately because of the fact that the heating is extremely localized in the area requiring heat for the solder. Thereafter, the lead frame can be removed from the apparatus and the well 42 filled with potting material 60, 62 as previously described.

Practice of the invention permits precise control of the amount of solder used and therefore precise control of the thickness of the solder layer between the chip and the surface of the heat sink. Usually, a solder layer having a thickness of about 0.001" is regarded as optimum. The excess solder will, as mentioned above, flow into the solder bins. Since the bonding operation is carried out with a heat source which produces localized heating, no damage results to the premolded housing 38, which, being of a thermoplastic material, is totally incapable of withstanding the commonly used bonding technique of passing the heat sink through an oven.

We claim:

1. In a stamped and formed lead frame of the type used for mounting an IC chip, said lead frame being of the type comprising carrier means, a plurality of leads extending from edge portions of said carrier means in side-by-side coplanar relationship, a chip mounting plate on the end of one of said leads, said chip mounting plate having a chip supporting surface and a bottom surface, the remaining leads extending cantilever fashion from said carrier means and having free ends proximate to said chip supporting surface, contact surfaces on said free ends, the improvement to said lead frame comprising:

a housing comprising molded plastic material molded onto said lead frame in partially encapsulating relationship to said chip mounting plate and said free ends of said remaining leads, said molded plastic material having a well therein extending towards said contact surfaces and towards said chip receiving surface, said bottom surface being exposed, said contact surfaces being in said well and being exposed, said molded plastic material including a floor portion at the inner end of said well, said floor portion extending over a major portion of said chip receiving surface, a chip receiving cavity in said floor portion extending to said chip receiving surface so that said chip receiving surface is exposed at the inner end of said cavity, said cavity having cavity walls which conform to the edges of said chip whereby, upon placement of a chip in said cavity, said chip is precisely confined in said cavity against said chip receiving surface and is precisely located relative to said contact surfaces.

2. A stamped and formed lead frame as set forth in claim 1, having a solder-receiving bin means extending laterally in said housing from said chip-receiving cavity, said chip-receiving surface being exposed at the inner end of said solder-receiving bin means whereby, upon placement of a predetermined amount of solder in said chip-receiving cavity, placement of a chip in said chip-receiving cavity and upon thereafter heating said chip and said chip-receiving surface, said solder will be melted, excess solder will flow into said solder-receiving bin means and said chip will be soldered to said chip-receiving surface with a predetermined amount of solder, and electrodes on said chip can thereafter be connected to said contact surfaces by wire bonding.

3. A stamped and formed lead frame as set forth in claim 2, said lead frame having three leads extending from said edge portions of said carrier strip.

4. A stamped and formed lead frame as set forth in claim 3, said contact surfaces being coplanar, said chip-supporting surface being parallel to, and offset from, said contact surfaces.

5. A stamped and formed lead frame as set forth in either of claims 2 or 4, said chip-receiving cavity being square, said solder-receiving bin means comprising at least one bin extending laterally from one wall of said chip-receiving cavity.

6. A stamped and formed lead frame as set forth in claim 5, said chip-receiving cavity being rectangular, said solder-receiving bin means comprising four solder-receiving bins, each side of said cavity having one of said bins extending laterally therefrom.

7. A transistor of the type comprising an insulating body, first, second, and third leads, and on IC chip, said leads having inner ends which are embedded in said insulating body and having outer ends which extend from said insulating body, said first and third leads having contact surfaces on said inner ends thereof, said second lead having a chip-mounting plate on said inner end, said mounting plate having a chip-supporting surface and a bottom surface, said chip-mounting surface being in said insulating body, said bottom surface being exposed and being surrounded on its side edges by said insulating body, said insulating body comprising a premolded portion and a chip-encapsulating portion, said chip-encapsulating portion being contained within said premolded portion, said inner ends of said leads being embedded in said premolded portion, a well extending into said premolded portion towards said chip-receiving surface, said contact surfaces of said first and third leads being within said well, said well having an inner end surface which extends parallel to, and is spaced from, said chip-supporting surface, a chip-receiving cavity extending into said floor to said chip-receiving surface, said cavity having cavity walls which conform to the edges of said chip, and solder-receiving bin means extending laterally from at least one of said cavity walls, said chip being disposed in said cavity and being bonded to said chip-receiving surface by a predetermined mass of solder, excess solder being flowed into said bin means, said chip having termination areas which are connected to said contact surfaces by conductors disposed in said well and bonded to said termination areas and said contact surfaces, said well being filled with encapsulating material which was placed therein after bonding of said chip to said chip-supporting surface and bonding of said conductors to said electrode areas and said contact surfaces.

* * * * *